United States Patent [19]
Gupta et al.

[11] Patent Number: 5,954,888
[45] Date of Patent: Sep. 21, 1999

[54] POST-CMP WET-HF CLEANING STATION

[75] Inventors: Anand Gupta, Phoenix; Chris Karlsrud; Periya Gopalan, both of Chandler, all of Ariz.

[73] Assignee: SpeedFam Corporation, Chandler, Ariz.

[21] Appl. No.: 09/020,979

[22] Filed: Feb. 9, 1998

[51] Int. Cl.$^6$ .................................................. C23G 1/02
[52] U.S. Cl. ........................... 134/3; 134/902; 134/32; 438/691; 438/753
[58] Field of Search .................... 134/37, 3, 32, 134/902; 51/215 R, 131.3; 451/5; 156/636.1; 438/691, 753

[56] References Cited

U.S. PATENT DOCUMENTS

| | | | |
|---|---|---|---|
| 4,002,488 | 1/1977 | Campanelli | 134/7 |
| 4,417,945 | 11/1983 | Komatsuzaki . | |
| 4,944,119 | 7/1990 | Gill, Jr. et al. | 451/331 |
| 5,095,661 | 3/1992 | Gill, Jr. et al. | 451/111 |
| 5,306,671 | 4/1994 | Ogawa et al. . | |
| 5,317,778 | 6/1994 | Kudo et al. . | |
| 5,340,437 | 8/1994 | Erk et al. . | |
| 5,475,889 | 12/1995 | Thrasher et al. . | |
| 5,486,234 | 1/1996 | Contolini et al. . | |
| 5,551,986 | 9/1996 | Jain . | |
| 5,568,821 | 10/1996 | Ohmori et al. . | |
| 5,581,837 | 12/1996 | Uchiyama et al. . | |
| 5,609,719 | 3/1997 | Hempel | 438/693 |
| 5,626,159 | 5/1997 | Erk et al. . | |
| 5,626,681 | 5/1997 | Nakano et al. . | |
| 5,639,311 | 6/1997 | Holley et al. . | |
| 5,643,044 | 7/1997 | Lund | 451/5 |
| 5,651,160 | 7/1997 | Yonemizu et al. . | |
| 5,791,969 | 8/1998 | Lund | 451/5 |
| 5,836,325 | 11/1998 | Akanuma et al. | 134/183 |

FOREIGN PATENT DOCUMENTS

| | | |
|---|---|---|
| 0 764 478 A1 | 3/1997 | European Pat. Off. . |
| 08309297 | 11/1996 | Japan . |
| WO97/12392 | 4/1997 | WIPO . |
| WO97/13590 | 4/1997 | WIPO . |

Primary Examiner—Jill Warden
Assistant Examiner—Yolanda E. Wilkins
Attorney, Agent, or Firm—Snell & Wilmer L.L.P.

[57] ABSTRACT

The present invention provides a method for cleaning semiconductor work pieces following a Chemical Mechanical Planarization ("CMP") procedure. Initially, a work piece is scrubbed to remove some of the slurry material and other contaminants on the surfaces of the work piece. Next, the work piece is transported into a HF cleaning station wherein the work piece is positioned horizontally such that both the upper and lower surfaces are substantially exposed. The work piece then is immersed in a hydrogen fluoride ("HF") solution which is circulated around the various surfaces of the work piece. The work piece is immersed in the HF solution for a sufficient length of time to remove an appropriate layer of oxide, thereby removing contaminants and smoothing micro scratches from the surfaces of the work piece.

15 Claims, 10 Drawing Sheets

POST-CMP WET-HF CLEANING STATION

TECHNICAL FIELD OF THE INVENTION

The present invention relates generally to a method for cleaning semiconductor work pieces such as silicon wafers. More particularly, the present invention relates to a method that employs hydrogen fluoride ("HF") solution to remove contaminants and smooth scratches from the surfaces of work pieces.

BACKGROUND OF THE INVENTION

Removing foreign material from the surface of work pieces is a critical element in the manufacturing of semiconductor devices. The presence of contaminants or foreign material can lead to critical failures or prematurely shortened life spans of these devices.

In manufacturing semiconductor devices, silicon work pieces known as "wafers" are used. Wafers typically have a flat, circular disk-like shape. Wafers are initially sliced from a silicon ingot and, thereafter, undergo multiple masking, etching, and dielectric and conductor deposition processes to create microelectronic structures and circuitry on the wafers. The surface of a wafer undergoing these processes typically must be polished or planarized between processing steps to ensure proper flatness, thus permitting use of photo lithographic processes for building additional dielectric and metallization layers on the wafer surface.

Chemical Mechanical Planarization ("CMP") machines have been developed to polish or planarize silicon wafer surfaces to the flat condition necessary for manufacture of integrated circuit components and the like. CMP processes and machines are known in the art and are described in several U.S. Patents. Examples include U.S. Pat. No. 4,805,348, issued in February 1989, to Arai, et al.; U.S. Pat. No. 4,811,522, issued in March 1989 to Gill; U.S. Pat. No. 5,099,614, issued in March, 1992 to Arai et al.; U.S. Pat. No. 5,329,732, issued in July, 1994 to Karlsrud et al.; U.S. Pat. No. 5,476,890, issued in December 1995 to Masayoshi et al.; U.S. Pat. Nos. 5,498,196 and 5,498,199, both issued in March, 1996 to Karlsrud et al.; and U.S. Pat. No. 5,558,568, issued in September 1996 to Talieh et al.

CMP processes typically require the introduction of a polishing slurry onto the surface of the wafer as it is mechanically polished on a polishing table. The slurries typically are water based and may contain fine abrasive particles and incorporate chemical cleaning compositions, such as silica and alumina. Consequently, CMP processing of the wafers may leave micro scratch marks and contaminants such as leftover slurry particles and unwanted metallic ions (sodium, potassium, iron, chromium, nickel, manganese, zinc, titanium, etc).

In a conventional method of cleaning work pieces, scrub brushes are used with deionized ("DI") water, ammonia, or various other chemical solutions. However, scrub cleaning the work piece alone may not remove implanted metallic ions or micro scratch marks. Additionally, the application of mechanical action in combination with some chemical solutions, such as hydrogen fluoride ("HF"), may result in introduction of sub microscopic scratches. Safety and waste disposal concerns may be further disadvantages of this cleaning method.

In another conventional method for cleaning work pieces, a static bath of chemical solution such as HF solution may be used. Work pieces are typically placed vertically into the HF solution to remove a layer of oxide from the surfaces of the work pieces. However, this method also has several short-comings. For example, the HF solution gradually degrades as the cleaning operation is repeated, thus making it difficult to control the amount of oxide layer that will be removed from the work pieces. Additionally, air bubbles adhering to the surfaces of the work pieces as they are placed into the HF solution may result in nonuniform etching of the work pieces. Further, the reaction of silicon oxide with HF results in the formation of silicon fluoride and water molecules. Both the silicon fluoride and water molecules tend to stay at the work piece surface/HF solution interface, which may result in nonuniform etching of the work pieces. More particularly, the water molecules remaining at the work piece surface/HF solution interface will dilute the concentration of the HF at the work piece surface. Therefore, a need exists for a method to remove contaminants and smooth scratches from the surfaces of work pieces which overcomes the various short-comings associated with existing conventional methods.

SUMMARY OF THE INVENTION

The present invention relates to a method for removing contaminants and smoothing scratches from the surfaces of work pieces following CMP planarization. This is accomplished by removing a layer of oxide from the surfaces of the work pieces after the work pieces have been polished and/or planarized.

According to the present invention, a work piece is transported substantially horizontally into a chemical cleaning station from a previous process station. In turn, the work piece is positioned substantially horizontally within a receptacle whereby the upper and lower surfaces of the work piece are exposed. Next, a chemical solution is discharged into the receptacle thereby immersing the work piece in the chemical solution. Also, the chemical solution is circulated about the various surfaces of the work piece. After an appropriate layer of oxide has been removed from the surfaces of the work piece, the chemical solution is withdrawn from the receptacle. Finally, the work piece is transported to another process station.

BRIEF DESCRIPTION OF THE DRAWING FIGURES

The present invention will hereinafter be described in conjunction with the appended drawing figures, wherein like numerals generally denote like elements, and:

DETAILED DESCRIPTION OF PREFERRED EMBODIMENTS OF THE INVENTION

Figure 1:
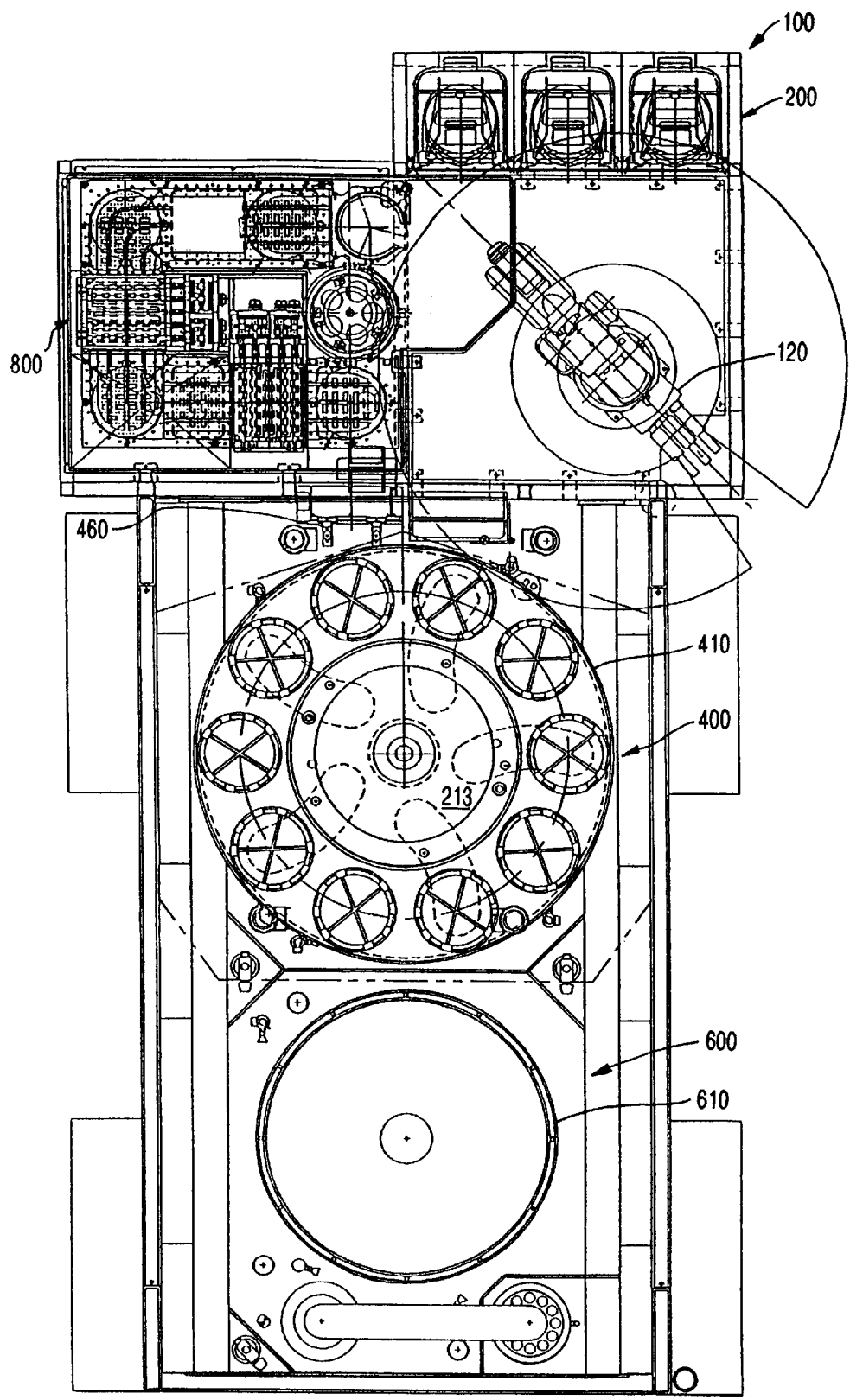
FIG. 1 is a top plan view of an exemplary CMP machine.
Figure 2:
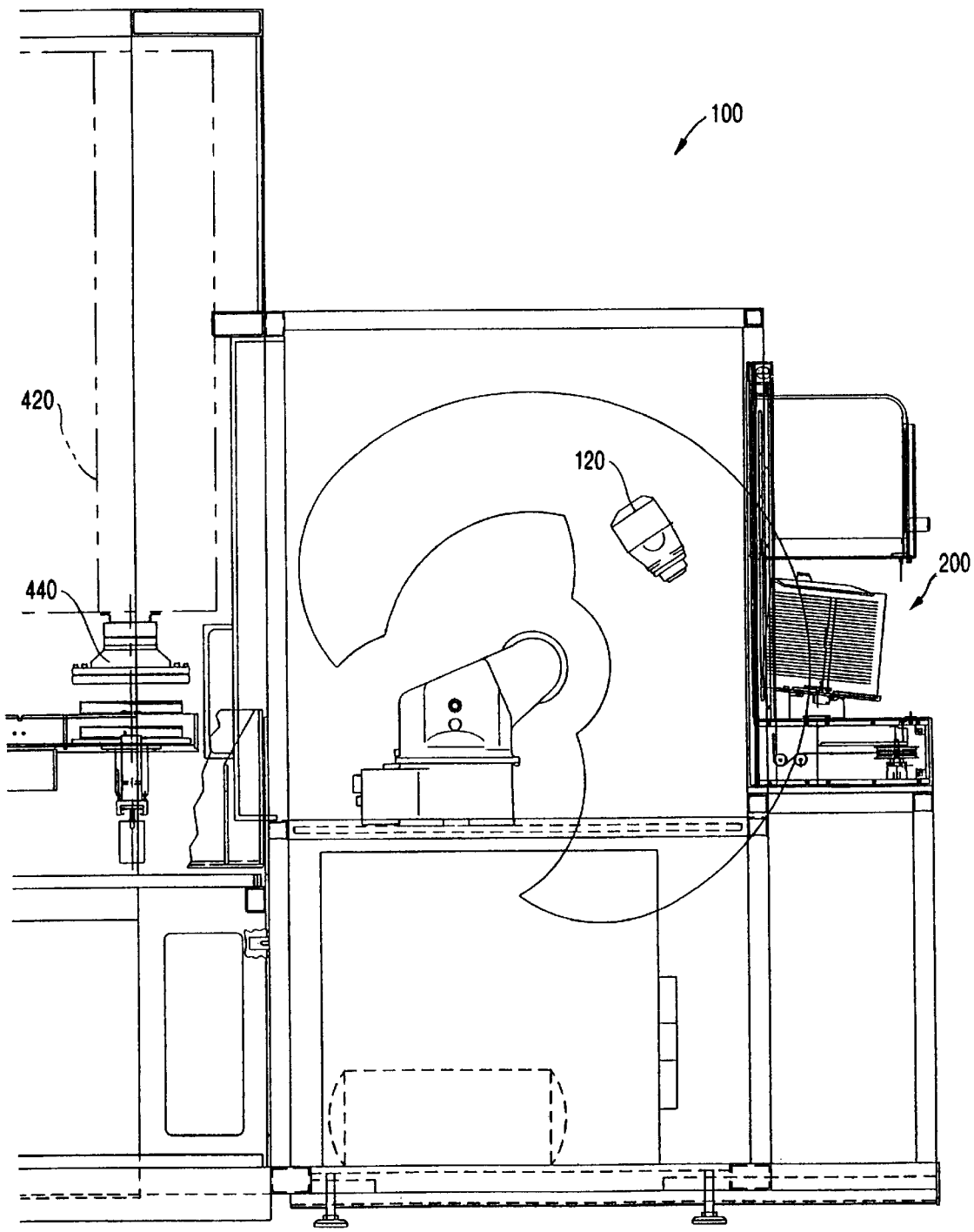
FIG. 2 is a side view of a load/unload station and a portion of an index station employed by the machine shown in FIG. 1.

Referring now to FIGS. 1 and 2, an exemplary integrated Chemical Mechanical Planarization ("CMP") machine 100 is shown. Machine 100 comprises work piece load/unload station 200, index station 400, CMP station 600, and cleaning station 800.

Robot arm 120 transports work pieces from load/unload station 200 to index station 400. More particularly, robot arm 120 loads five work pieces, one at a time, from load/unload station 200 onto an index table 410 in index station 400. Next, a multi-head transport assembly 420 lowers five wafer carrier heads 440 into proximity with index table 410 and picks up the five work pieces (FIG. 2). Transport assembly 420 then moves laterally into CMP station 600 and above polishing table 610. Transport assembly 420 then lowers such that the five work pieces are pressed against polishing table 610. To enhance the polishing process, a polishing slurry is preferably provided, and the individual carriers are rotated on and oscillated radially across the polishing surface. The polishing slurry used may be, for example, a water-based slurry comprising colloidal silica particles. In this manner, the surfaces of the work pieces are polished and/or planarized. Although in the above described embodiment five work pieces are planarized at the same time, one skilled in the art will quickly realize that any number of work pieces may be polished at a time without departing from the spirit and scope of the present invention. For a more detailed discussion of the CMP processes, see U.S. patent application Ser. No. 08/926,700, filed Sep. 10, 1997, which is incorporated herein by reference.

Unfortunately, mechanical polishing of the work pieces in conjunction with the use of the polishing slurry may leave scratches and slurry material and other contaminants remaining on the work pieces following the polishing process. These contaminants and scratches may lead to failures or prematurely shortened life spans of devices manufactured from the work pieces. Therefore, the work pieces are scrubbed, cleaned, rinsed, and dried in cleaning station 800 to remove contaminants and smooth scratches from the surfaces of the work pieces.

Figure 3:
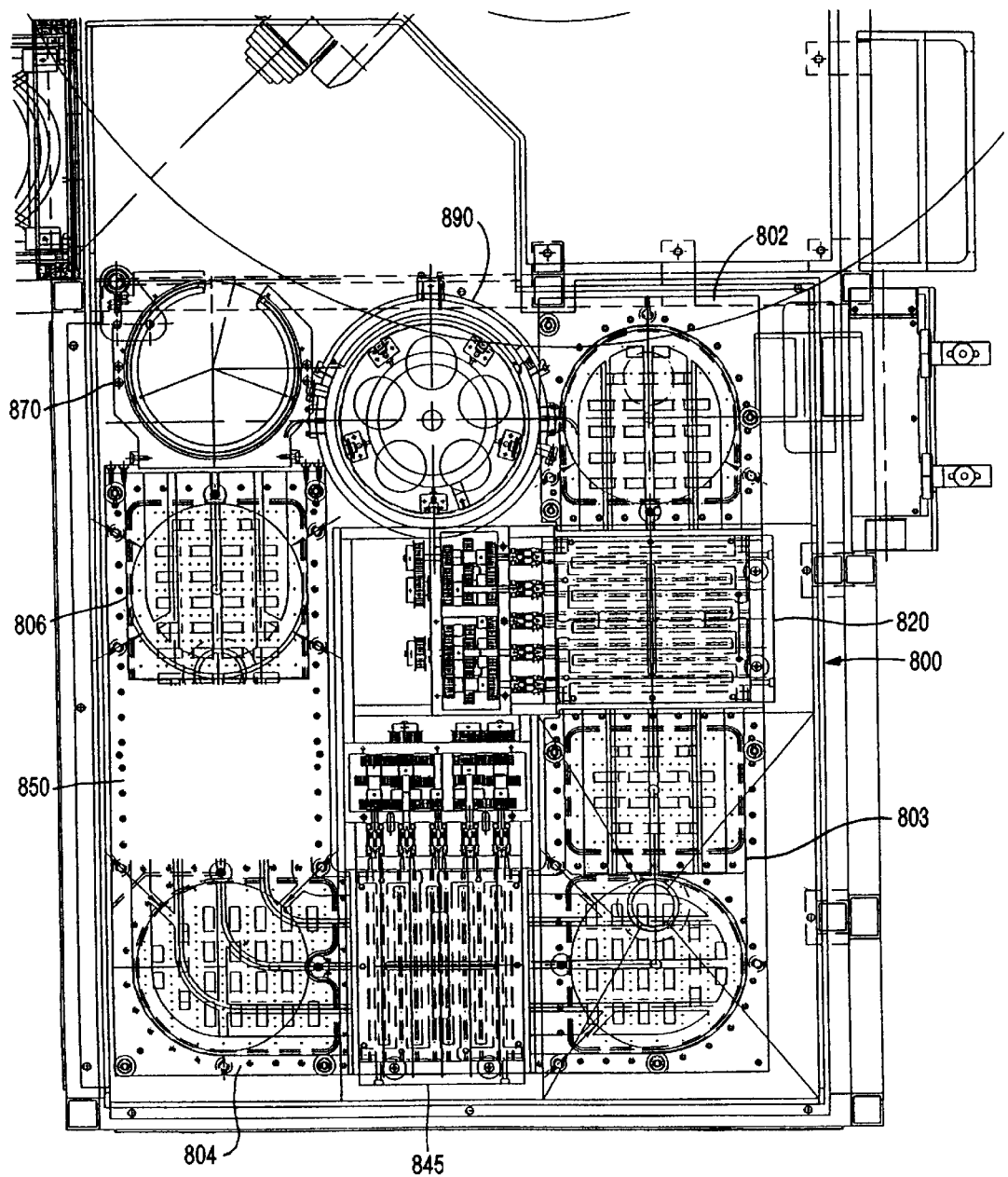
FIG. 3 is a top plan view of a cleaning station employed by the machine shown in FIG. 1.

Accordingly, flipper arm 460 lifts the work pieces out of index station 400 and transports them to cleaning station 800. Referring now to FIG. 3, cleaning station 800 preferably includes first, second, third and fourth water tracks 802, 803, 804 and 806, scrub stations 820 and 845, HF cleaning station 850, rinse station 870 and spin-dry station 890.

Figure 4:
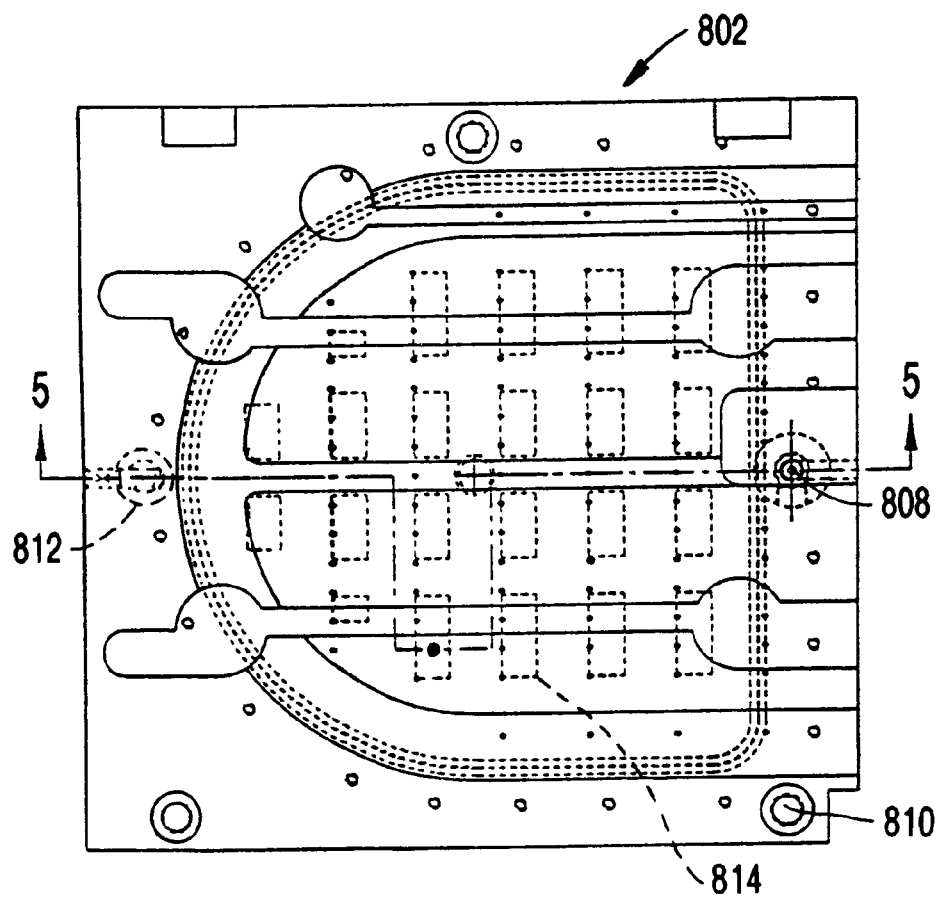
FIG. 4 is a top plan view of a water track employed by the cleaning station shown in FIG. 3.
Figure 5:
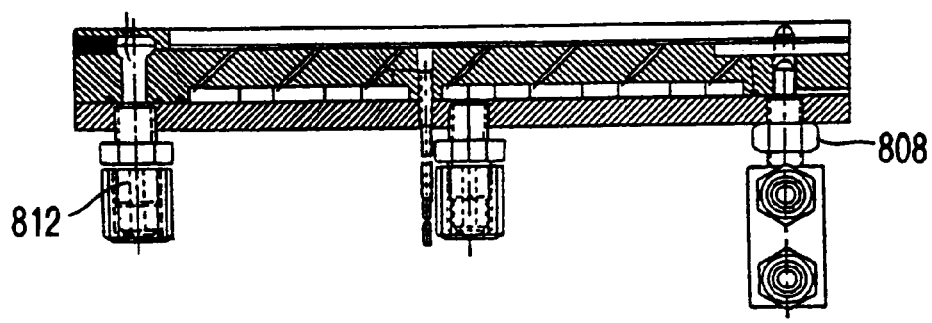
FIG. 5 is a sectional view of the water track taken through lines 5—5 shown in FIG. 4.

In a preferred embodiment of the present invention, each substation within cleaning station 800 (scrub stations 820 and 845, HF cleaning station 850, rinse station 870 and spin-dry station 890) processes one work piece at a time. Accordingly, a work piece is loaded onto water track 802 in cleaning station 800 and remains in water track 802 until scrub station 820 is clear to receive the next work piece. More particularly with reference to FIGS. 4 and 5, track 802 includes staging pin 808 and reverse fluid nozzles 810 to help maintain the work piece within the track. When scrub station 820 is clear to receive the work piece, staging pin 808 lowers and fluid nozzles 810 turn off. In addition, a forward fluid nozzle 812 provides a burst or steady stream of fluid and angled fluid jets 814 help to encourage the work piece onto the scrub station 820. In a similar manner, water track 803 transports the work piece from scrub station 820 to scrub station 845, water track 804 transports the work piece from scrub station 845 to HF cleaning station 850, and water track 806 transports the work piece from HF cleaning station 850 to rinse station 870.

Water tracks 802, 803, 804 and 806 also include a plurality of fluid jets which project fluid upwardly to support the work pieces, such that mechanical contact between the work pieces and the water track is substantially eliminated. The use of water tracks 802, 803, 804 and 806 to transport the work piece between the various stations has the advantage of keeping the work piece wet, thereby preventing contaminants from drying on the work piece surface. In a preferred embodiment, the fluid used in water tracks 802, 803, 804 and 806 to transport the work piece includes deionized water.

Figure 6:
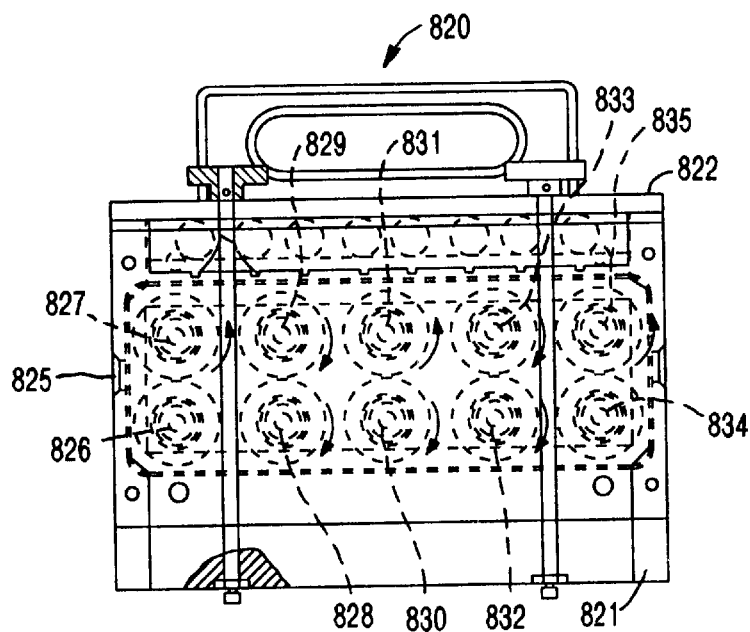
FIG. 6 is a side view of a scrubber station utilized by the cleaning station shown in FIG. 3.
Figure 7:
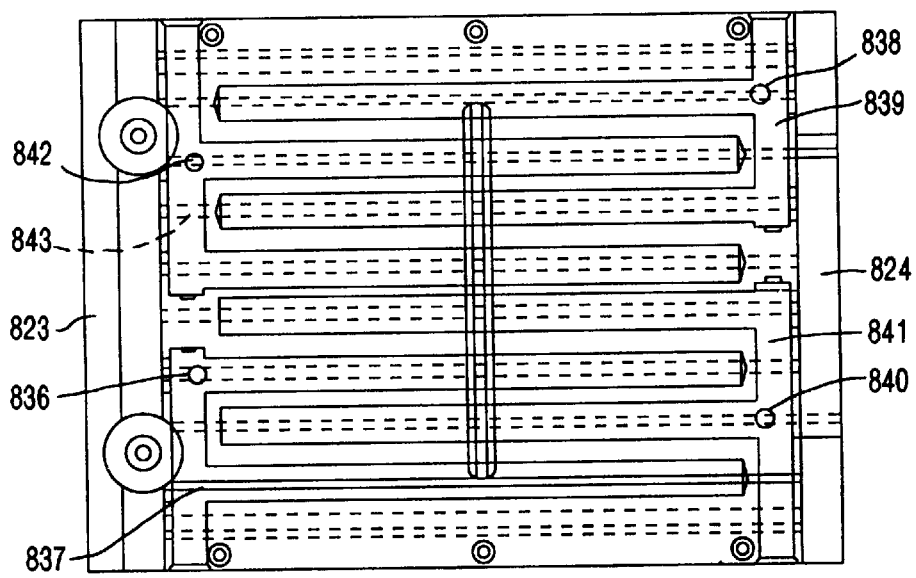
FIG. 7 is a top plan view of the scrubber station shown in FIG. 6.

When scrub station 820 is clear, water track 804 moves the work piece into scrub station 820 as shown in FIG. 3. Referring now to FIGS. 6 and 7, scrub station 820 includes a plurality of pairs of rollers, a bottom panel 821, a top panel 822, a rear panel 823, and a front panel 824. Commercially available scrub stations such as those manufactured by Wacker Chemtronic company of Germany may be utilized.

The work piece enters scrub station 820 at work piece input 825. A plurality of roller pairs then simultaneously clean the top and bottom surfaces of the work piece and urge the work piece through scrub station 820. The bottom rollers (i.e., rollers 826, 828, 830, 832 and 834) rotate clockwise as shown in FIG. 6. Additionally, the top roller of each even roller pair (i.e., rollers 829 and 833) also rotates clockwise as shown in FIG. 6. Finally, the top roller in each odd roller pair (i.e., rollers 827, 831 and 835) rotate counter-clockwise. Consequently, the odd roller pairs (i.e., rollers 826, 827, 830, 831, 834 and 835) urge the work piece through scrub station 820. The even roller pairs (i.e. rollers 828, 829, 832 and 833) clean the top and bottom surfaces of the work piece as it moves through the scrub station 820. Additionally, the rotation of the brushes may be reversed to maintain the wafer in scrub station 820 until water track 804 is available to receive the work piece.

Referring now to FIG. 7, top panel 822 comprises one or more fluid inlet ports configured to distribute fluid to a discrete portion of, or to the entirety of, the inside of scrub station 820. Top panel 822 preferably includes a number of manifolds arranged to deliver fluid to specific locations within scrub station 820. In particular, panel 822 comprises a first fluid inlet port 836 that communicates with a first manifold 837 configured to distribute a first fluid proximate a number of rollers within the roller box. First manifold 837 is preferably disposed to release fluid substantially evenly along the length of one or more of the top rollers. Top panel 822 further comprises a second fluid inlet port 838 similarly configured in communication with a second manifold 839 for distributing a second fluid throughout a different portion of the roller box, for example, in the region occupied by the first several roller pairs. Top panel 822 further comprises a third fluid inlet port 840 in communication with a third manifold 841 configured to distribute a third fluid throughout a third region of the roller box, for example, a region proximate the last several roller pairs. Top panel 822 may also include a fourth fluid inlet port 842 that communicates with a fourth manifold 843.

Each individual manifold is configured such that it is fluidly distinct from each of the remaining manifolds. However, one or more of the fluid inlet ports may be coupled together such that a single fluid may be applied to more than one manifold. In the exemplary embodiment, shown in FIG. 7, the manifolds are configured to distribute cleaning fluid to locations above and/or between adjacent rollers (the rollers are depicted in phantom lines in FIG. 7).

A plurality of different chemicals (e.g., water, cleaning solutions, surfactants, friction reducing agents, and agents to control the pH of the various solutions) may be applied through the manifolds located on top panel 822. The various fluid inlet ports may be coupled together such that different chemicals may be applied into discrete regions of the roller boxes. In this manner, work pieces passing through a first set of rollers may be exposed to a first chemical solution and later exposed to a second chemical solution in a latter stage of the roller box. For example, the first roller box may distribute a cleaning solution and deionized water mix onto the work pieces to facilitate heavier cleaning, while the second roller box may simply distribute deionized water onto the work pieces to achieve a rinse.

In a preferred embodiment, the work piece is transported by water track 803 from scrub station 820 to scrub station 845. The work piece is scrub cleaned in substantially the same manner in scrub station 845 as in scrub station 820. One skilled in the art will realize that scrub station 845 may be removed and the work piece transported directly from scrub station 820 to HF cleaning station 850 without departing from the spirit and scope of the present invention.

Regardless of whether the work piece is scrub cleaned once or twice, the scrub cleaning of work pieces with chemicals such as deionized water may not remove scratches or other surface defects or contaminants which may be implanted within the scratches or other surface defects on the work piece. In an effort to more effectively remove these contaminants and scratches, HF may be used in conjunction with scrub cleaning. However, the use of HF in conjunction with mechanical scrub cleaning may itself introduce sub-micro scratches on the surfaces of the work piece, which may trap metal ions and other contaminants. As previously stated, contaminants and scratches on the surfaces of the work piece may lead to failures or prematurely shortened life spans of devices manufactured from the work piece. Consequently, removal of these contaminants and smoothing of scratches from the surfaces of the work piece is highly desirable.

Figure 8:
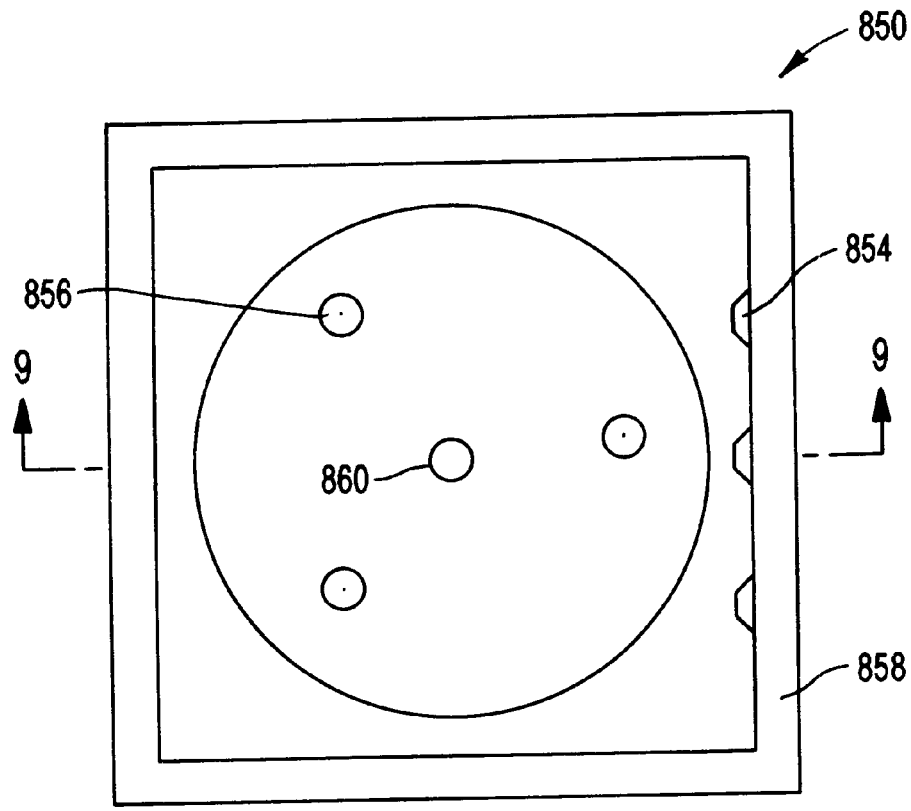
FIG. 8 is a top plan view of a HF cleaning station utilized by the cleaning station shown in FIG. 3.
Figure 9:
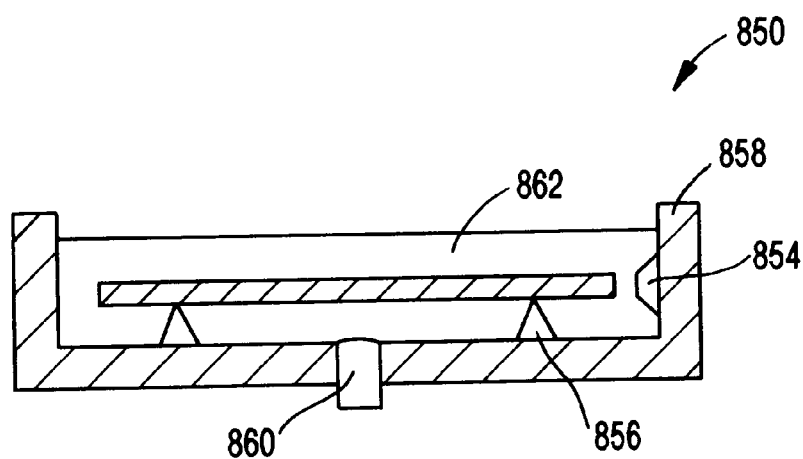
FIG. 9 is a cross sectional view of the HF cleaning station taken through lines 9—9 shown in FIG. 8.

When HF cleaning station 850 is clear, water track 804 transports the work piece from scrub station 820 into HF cleaning station 850 as shown in FIG. 3. Referring now to FIGS. 8 and 9, HF cleaning station 850 preferably includes a receptacle 858, a plurality of support members 856, and a plurality of solution delivery members 854.

Water track 804 transports the work piece into receptacle 858, which is sufficiently sized to receive the work piece. The work piece is positioned in a substantially horizontal orientation by the plurality of support members 856. Support members 856 may include staging pins which permit the positioning of the work piece within receptacle 858 while contacting a relatively small portion of the bottom surface of the work piece.

When the work piece is transported into receptacle 858 by water track 804, receptacle 858 is filled with a rinse fluid. Drain 860 then removes the rinse fluid from receptacle 858. Next, a plurality of solution delivery members 854 delivers solution 862 into receptacle 858, thereby immersing the work piece in solution 862 such that substantially all of the surfaces of the work piece are submerged in solution 862.

In a preferred embodiment, the rinse fluid used includes deionized water and cleaning solution 862 includes HF solution. More particularly, a relatively low concentration of HF solution may be used. The concentration of HF solution used may vary from a concentration of 25 part water to 1 part HF to a concentration of 200 part water to 1 part HF. The use of a relatively low concentration of HF solution has many advantages. For example, a relatively low concentration of HF solution results in a slower etch rate, which results in more time for the HF solution to disperse thereby resulting in a more uniform etch. A slower etch rate also provides for a greater margin of error in process time from work piece to work piece, thereby increasing work piece to work piece uniformity. Also, less time will be required to rinse a relatively low concentration of HF from the surfaces of the work piece. Additionally, working with a low concentration of acid is safer than a high concentration of acid, thereby requiring fewer hazardous chemical handling procedures and devices. However, too low a concentration of HF solution may result in reducing throughput of the work piece. In a most preferred embodiment of the present invention, a concentration of 50 part water to 1 part HF is used.

A plurality of solution delivery members 854 also circulates the HF solution about the surfaces of the work piece. Circulation of the HF solution agitates the HF solution such that fresh portions of HF solution may contact the various surfaces of the work piece, thereby resulting in a more uniform application of the solution. The HF solution is circulated about the surfaces of the work piece such that the HF solution flows across the top and bottom surfaces of the work piece with a substantially laminar flow profile. The laminar flow of HF solution may help to dislodge air bubbles which may adhere to the surfaces of the work piece, thereby producing a more planar surface. Additionally, the laminar flow of HF solution may help to dislodge silicon fluoride and water molecules, which formed from the reaction of silicon oxide and HF, from the surfaces of the work piece, thereby producing a more planar surface. In the context of this invention, laminar flow refers to flow which is characterized by movement of the HF solution in layers. In particular, laminar flow is distinguished from turbulent flow in that in laminar flow there is no macroscopic mixing of adjacent fluid layers.

The work piece is immersed in the HF solution for a sufficient length of time to remove an appropriate layer of oxide. The amount of oxide removed may vary from 50 to 100 Å. The rate at which HF removes oxide from the work piece is a function of (among other factors) the concentration of the HF solution and temperature. A higher concentration of HF solution results in a faster removal rate. Similarly, a higher HF solution temperature results in a faster removal rate. However, a high HF solution temperature may produce HF vapors which may be hazardous. In a most preferred embodiment of the present invention, the work piece is immersed in a HF solution with a concentration of 50:1 $H_2O$:HF at ambient temperature for approximately 20 seconds to remove approximately 50 Å of oxide from the surfaces of the work piece, thereby removing contaminants and smoothing micro scratches from the surfaces of the work piece.

Next, drain 860 removes the HF solution from receptacle 858. Receptacle 858 is then filled with rinse fluid to rinse the residual HF solution from the surfaces of the work piece. Filling receptacle 858 with rinse fluid may also facilitate transport of the work piece out of receptacle 858. More particularly, a nozzle (not shown) within receptacle 858 may urge the work piece forward so that it may be transported by water track 804. Receptacle 858 may be filled with rinse fluid through a nozzle (not shown) within receptacle 858 or by allowing fluid from water track 804 to flow into receptacle 858.

Figure 10:
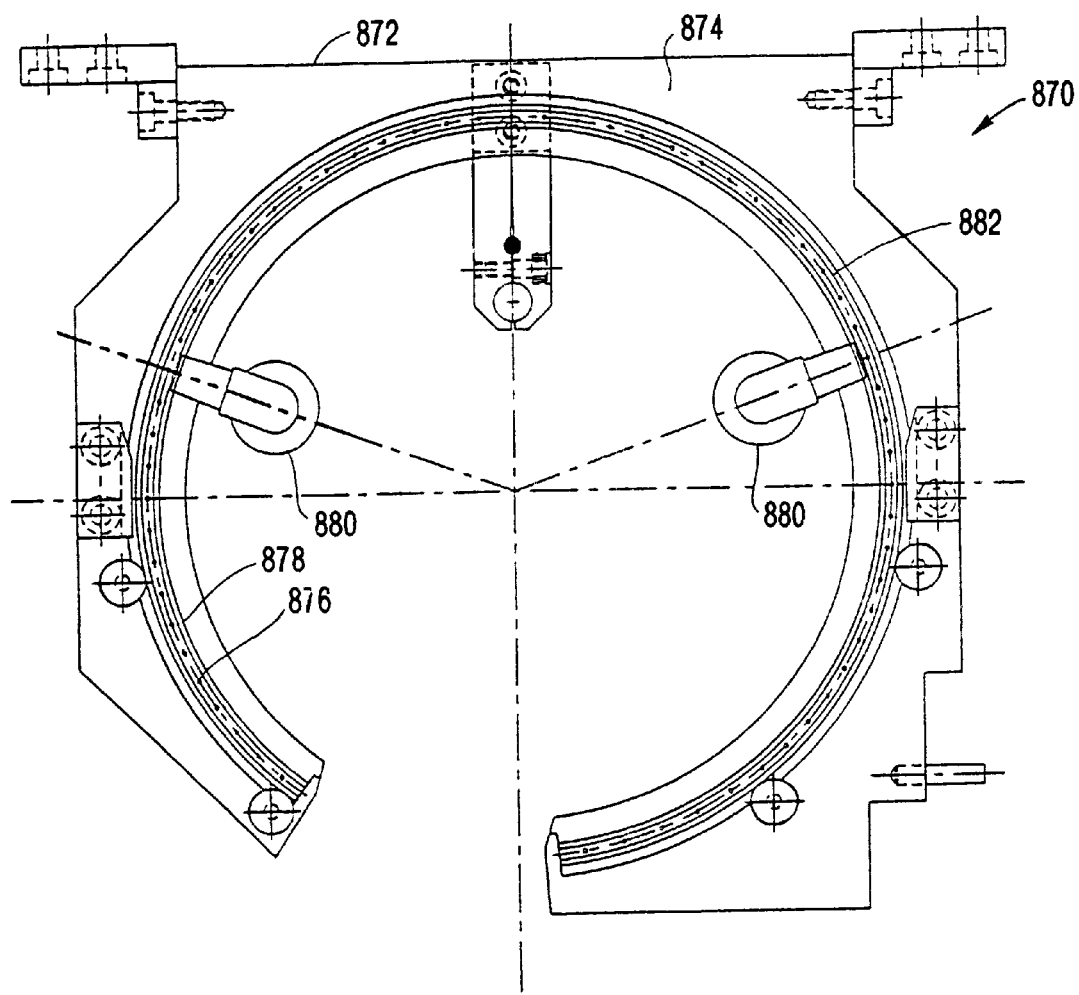
FIG. 10 is a top plan view of a rinse station employed by the cleaning station shown in FIG. 3.

As shown in FIG. 3, water track 806 then transports the work piece onto rinse station 870. Referring now to FIG. 10, rinse station 870 comprises a rinse ring 872 which preferably includes a ring body 874 for holding work pieces during the rinsing process. Ring body 874 preferably includes a plurality of jets 876 disposed about a substantially horizontal surface 878 of ring body 874. Fluid supply ports 880 supply fluid to the internal region of manifold 882 such that fluid is ejected from respective jets 876 at a substantially uniform pressure and flows about the arc defined by surface 878.

When a work piece is substantially centered within the rinse ring and supported by fluid ejected from jets 876, rinse ring 872 is caused to tilt downwardly as shown in FIG. 10. thus deviating from the horizontal plane by an angle in the range of 10°–50°, and most preferably about 30°. In this position, preferably a laminar flow of rinsing fluid is supplied to both the upper surface and bottom surface of the work piece. More particularly, a first fluid nozzle 884 is configured to discharge rinse fluid at the upper surface of the work piece, substantially in the direction of arrow 886. A second rinse nozzle 888 is suitably configured to discharge rinse fluid at the bottom surface of the work piece, substantially in the direction of arrow 889. While rinse station 870 has been described herein as having a tiltable rinse ring, one should appreciate that the rinse ring may be fixed at an angle of about 10°–50°, and most preferably about 30° from the horizontal position.

Figure 11:
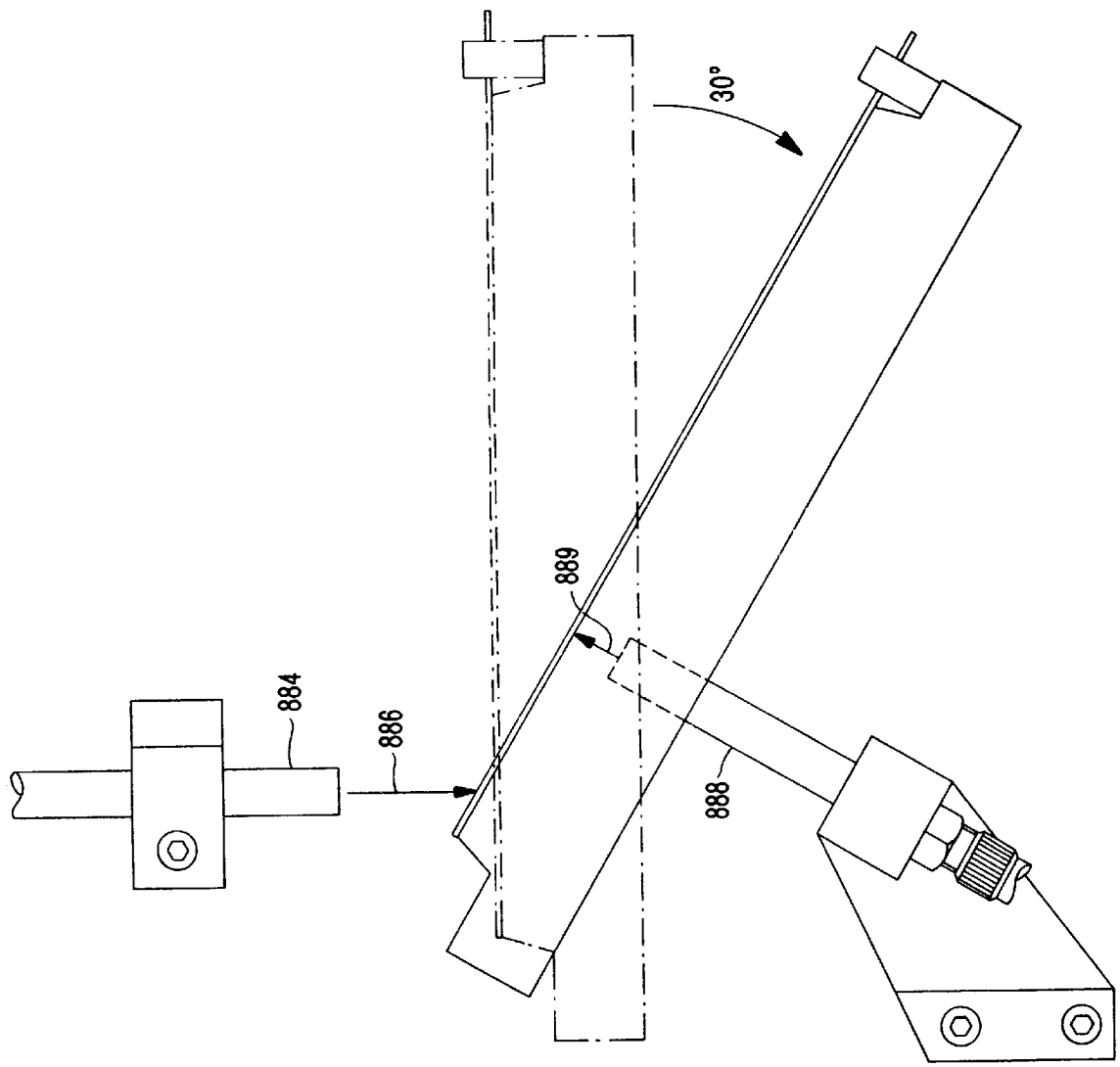
FIG. 11 is a side view of the rinse station shown in FIG. 10 in a decline position.

Throughput may be increased by simultaneously rinsing both the upper and lower surfaces of each work piece. Moreover, by orienting upper surface rinse fluid supply port 884 with respect to the upper surface of the work piece as shown in FIG. 11, the perimeter edge of the work piece also may be effectively rinsed. In a preferred embodiment, rinse fluid is applied to the top surface at a rate in the range of 0.1–20 liters/minute, and most preferably at a rate of about 4–5 liters/minute. Similarly, rinse fluid is advantageously applied to the bottom surface at a rate in the range of 0.1–10 liters/minute, and most preferably at a rate of about 1.5 liters/minute.

Figure 12:
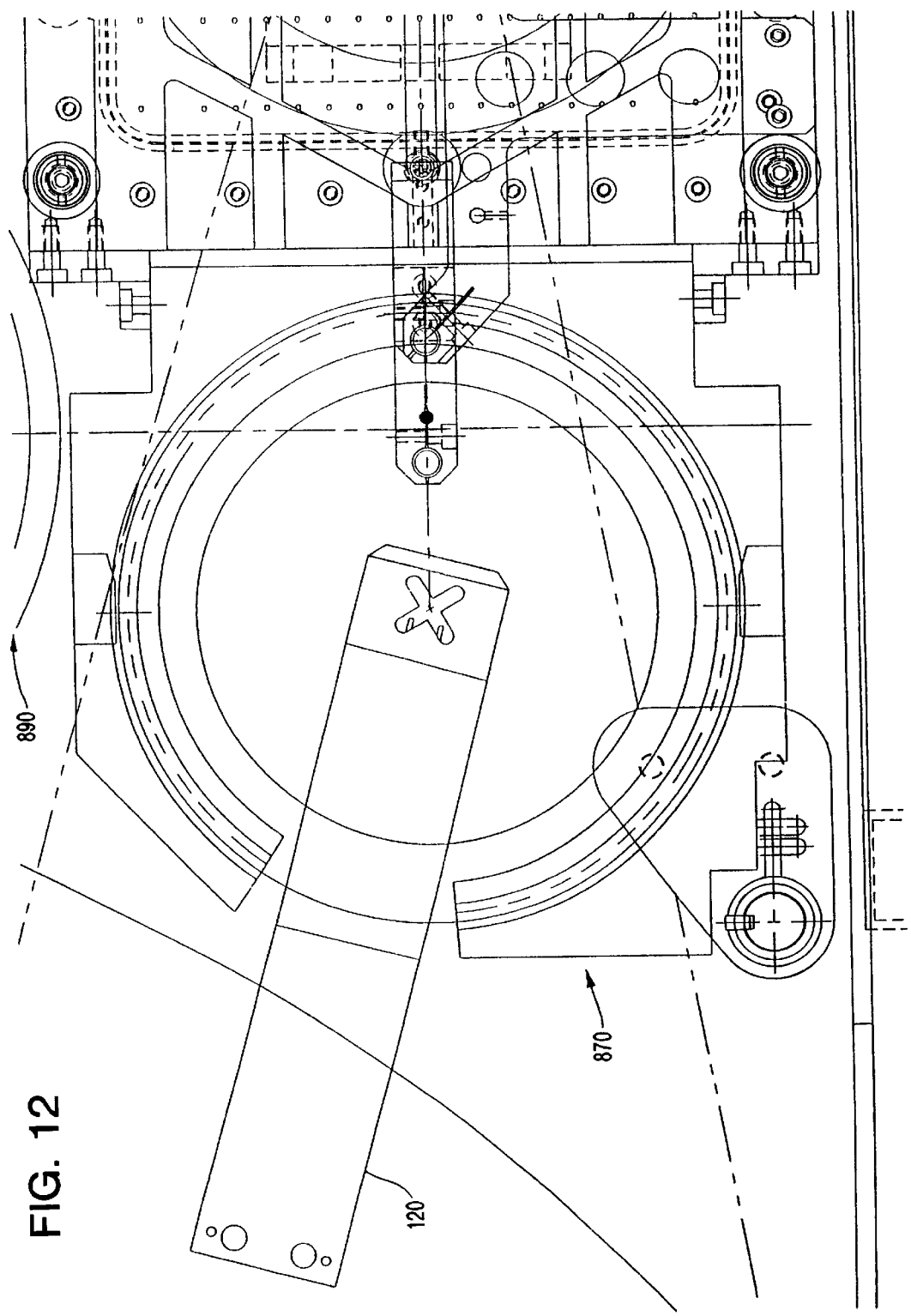
FIG. 12 is another top plan view of the rinse station, depicting entrance of a robot into the rinse station to retrieve a work piece.

Upon completion of the rinsing operation, the tilted rinse ring assembly is manipulated back to the horizontal position and robot 120 retrieves rinsed work pieces and transfers them to spin dryer station 890. As is particularly depicted in FIG. 12, robot 120 enters rinse station 870 to retrieve a rinsed work piece and transfer it to spin dryer station 890. Alternatively, robot 120 may retrieve rinsed work pieces from the rinse ring while the rinse ring is in the tilted position.

One skilled in the art will realize that the work piece may be transported directly from HF cleaning station 850 to spin dry station 890 without rinsing at rinse station 870. As described above, the work piece may be rinsed with rinse fluid at the HF cleaning station 850. HF cleaning station 850 may be appropriately configured to permit robot arm 120 to transport the work piece to spin dry station 870. Transporting the work piece directly from HF cleaning station 850 to spin dry station 890 would have the advantage of increasing throughput.

Figure 13:
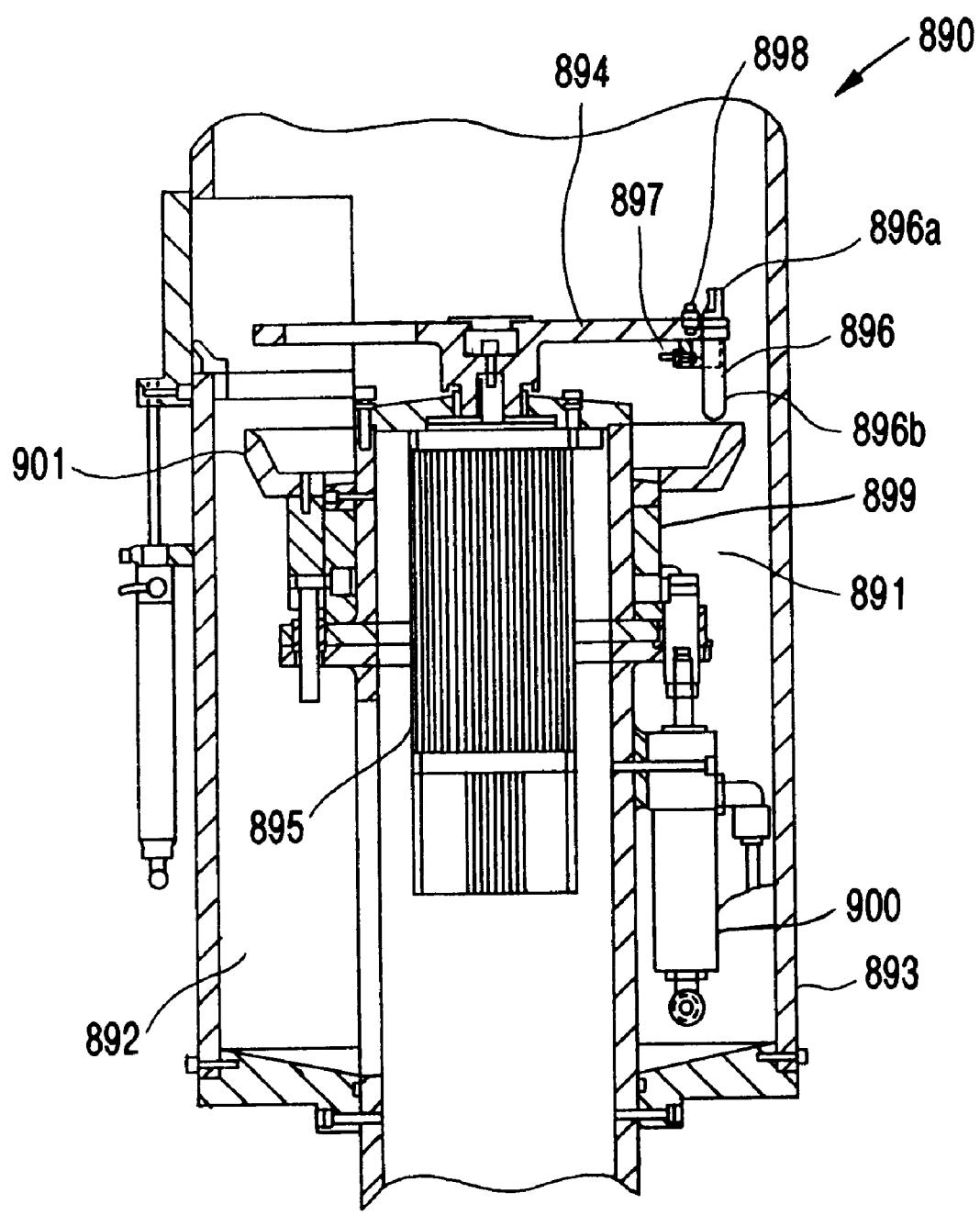
FIG. 13 is a sectional view of a spin dryer station utilized by the cleaning station shown in FIG. 3.

Referring now to FIG. 13, spin dryer station 890 includes a spin dryer 892 enclosed within a chamber 892 defined by a shroud or shield 893. Spin dryer 892 includes a work piece platform 894 configured to hold a work piece securely thereon as the platform is spun at high velocities by motor 895. Preferably, a plurality of mass-reducing apertures are formed through platform 894 in order to reduce the mass of spin dryer 892 and thereby minimize spin cycle acceleration and deceleration times.

A plurality of gripping fingers 896 are pivotally mounted around the outer periphery of platform 894 to grasp or grip the edges of a work piece placed on platform 894 by robot 120. Fingers 896 include a head portion 896a which extends above platform 894 and engages the work piece, and a shank portion 896b which extends below platform 894. Gripping fingers 896, or at least the portions 896a which contact the work pieces, are made of a soft, pliable material, such as Ertalyte, that will not damage or scratch the held work pieces. Spring-loaded plungers 897 mounted below platform 894 contact bias shank portions 896b radially outwardly, thereby moving head portions 896a radially inwardly, to maintain gripping fingers 896 in a gripping or secured position. Work pieces loaded onto spin dryer 892 do not rest directly on platform 894 but instead rest on support pins 898, which are also made of a soft, pliable material.

Actuator assembly 899 mounted below platform 894 serves to spread the gripping fingers apart and release held work pieces as follows. Assembly 899 is vertically movable by virtue of its attachment to an air cylinder 900. When actuator assembly 899 is moved upwards, cam ring 901 which forms a part of assembly 899 contacts shank portions 896b of gripping fingers 896. As the shank portions slide along the cam surface of cam ring 901, they are forced to pivot radially inwardly which, in turn, causes head portions 896a to pivot radially outwardly to release a work piece or to provide clearance for a work piece to be loaded.

Hence, after wet end-effector 118 of robot 120 has retrieved a rinsed work piece from rinse station 870, it transfers the work piece onto platform 394 of spin dryer 890. Gripping fingers 896 are held in an open position by actuator assembly 899 until the work piece has been loaded and properly positioned. After end-effector 118 moves away, actuator assembly 899 lowers out of contact with shank portions 896b, and plungers 897 again bias gripping fingers 896 towards a closed position to secure the work piece for spin drying. Platform 894 is accelerated by motor 895 to a velocity of approximately 4,000 rpm in preferably about 1.0 seconds, is spun at that speed for preferably about 20 seconds to remove all water and other particulates from the work piece surfaces, and is then decelerated back to an idle condition in preferably about 1.0 seconds.

During spinning, the centrifugal forces applied to the work piece held on platform 894 draws water droplets radially outwardly and off of the work piece surfaces. To augment this drying process, an air flow module may be mounted above shield 893 to direct a column of forced air across the upper work piece surface.

Once spin drying is complete, actuator assembly 899 is again moved upwardly to engage shank portions 896b and cause gripping fingers 896 to move to a release position as described above. Assembly 899 is maintained in this position until the dried work piece has been retrieved by robot 120 and cleared out of spin dryer station 890. Robot 120 then returns the dried work piece to the slot of the cassette from which the work piece originated.

Although specific embodiments, including specific process steps, process parameters, solutions, etc. have been described, various modifications to the disclosed embodiments will be apparent to one of ordinary skill in the art upon reading this disclosure. For example, the work pieces may be rinsed with rinse fluid in HF cleaning station 850 then directly transported into spin-dry station 890, thus eliminating rinse station 870. Therefore, it is to be understood that such embodiments are merely illustrative of and not restrictive on the broad invention and that this invention is not limited to the specific embodiments shown and described herein.

What is claimed is:

1. A method of cleaning work pieces to remove contaminants and smooth micro scratches, the method comprising the following steps:

obtaining a work piece from a previous process station in a substantially horizontal position on a water track;

maintaining the work piece in a substantially horizontal position while exposing the upper and lower sides of the work piece; and exposing the work piece in a dilute hydrogen fluoride (HF) solution for a predetermined period of time.

2. The method of claim 1 wherein the work piece is exposed to a HF solution having a concentration of 50 parts water to one part HF.

3. The method of claim 1 wherein said exposing step is performed for approximately 20 seconds.

4. The method of claim 1 wherein the exposing step is performed until approximately 50 Å of oxide is removed from the work piece surfaces.

5. The method of claim 1 further comprising a step of circulating the HF solution about the surfaces of the work piece, said circulating step being performed after said immersing step.

6. The method of claim 5 wherein said circulating step causes the dilute HF solution to circulate across the top and bottom of the workpiece forming a laminar flow profile on both sides of the work piece.

7. A method of cleaning work pieces after a Chemical Mechanical Polishing (CMP) procedure to remove contaminants and smooth micro scratches, the method comprising the following steps:

obtaining a work piece from a previous CMP process station on a water track;

positioning the work piece to expose the upper and lower surfaces of the work piece;

immersing the work piece in a dilute HF solution for a predetermined period of time for an established period of time; and circulating the dilute HF solution across the top and bottom of the workpiece forming a laminar flow profile on the upper and lower surfaces of the work piece.

8. The method of claim 7 wherein the work piece is immersed in a HF solution having a concentration of 50 parts water to one part HF.

9. The method of claim 7 wherein said immersion step is performed for approximately 20 seconds.

10. The method of claim 7 wherein the immersion step is performed until approximately 50 Å of oxide is removed from the work piece surfaces.

11. The method of claim 7 further comprising a step of rinsing the work piece with a rinsing solution, said rinsing step following said circulating step.

12. The method of claim 11 wherein said rinsing step rinses said work piece with deionized ("DI") water.

13. A method for processing work pieces comprising the following steps:

providing a work piece to be polished, scrubbed, cleaned and dried;

transporting the work piece to a polishing station on a water track;

polishing the work piece at said polishing station;

transporting the work piece to a scrubbing station;

scrubbing the work piece at said scrubbing station to remove slurry and particulate associated with the polishing process;

transporting the work piece to a HF cleaning station;

cleaning the work piece by applying a dilute HF solution to both upper and lower sides of the work piece for a predetermined period of time, wherein the work piece is positioned substantially horizontally at said HF cleaning station;

rinsing the work piece at said rinsing station;

transporting the work piece to a drying station; and drying the work piece at said drying station.

14. The method of claim 12 wherein said cleaning step applies a HF solution having a concentration of 50 parts water to one part HF.

15. The method of claim 13 wherein said polishing, scrubbing, HF cleaning, rinsing, and drying stations are all integral to one Chemical Mechanical Planarization ("CMP") machine.

* * * * *